United States Patent
Kawahara

(10) Patent No.: US 12,288,767 B2
(45) Date of Patent: Apr. 29, 2025

(54) SEMICONDUCTOR DEVICE

(71) Applicant: DENSO CORPORATION, Kariya (JP)

(72) Inventor: Hideki Kawahara, Kariya (JP)

(73) Assignee: DENSO CORPORATION, Kariya (JP)

(*) Notice: Subject to any disclaimer, the term of this patent is extended or adjusted under 35 U.S.C. 154(b) by 379 days.

(21) Appl. No.: 17/842,086

(22) Filed: Jun. 16, 2022

(65) Prior Publication Data

US 2022/0415843 A1     Dec. 29, 2022

(30) Foreign Application Priority Data

Jun. 29, 2021 (JP) .................................. 2021-107963

(51) Int. Cl.
*H01L 23/48*     (2006.01)
*H01L 23/00*     (2006.01)

(52) U.S. Cl.
CPC ...... *H01L 24/37* (2013.01); *H01L 2224/3755* (2013.01); *H01L 2924/13055* (2013.01)

(58) Field of Classification Search
CPC .......... H01L 2924/13055; H01L 24/37; H01L 2224/3755
See application file for complete search history.

(56) References Cited

U.S. PATENT DOCUMENTS

| | | | | |
|---|---|---|---|---|
| 2007/0216013 A1* | 9/2007 | Funakoshi | .............. | H01L 24/40 257/691 |
| 2010/0123240 A1* | 5/2010 | Sato | ................. | H01L 23/49524 257/692 |
| 2014/0159230 A1 | 6/2014 | Kadoguchi | | |
| 2016/0358838 A1* | 12/2016 | Basler | ...................... | H01L 23/24 |
| 2017/0278774 A1 | 9/2017 | Hayashi et al. | | |

FOREIGN PATENT DOCUMENTS

| | | |
|---|---|---|
| JP | 2007-48889 A | 2/2007 |
| JP | 2012-186273 A | 9/2012 |
| JP | 2021-086958 A | 6/2021 |

* cited by examiner

*Primary Examiner* — Hoa B Trinh
(74) *Attorney, Agent, or Firm* — Posz Law Group, PLC

(57) ABSTRACT

A semiconductor device includes a semiconductor element, a conductive member, and solder portions. The semiconductor element includes first main electrodes and a protective film on a first main surface, and a second main electrode on a second main surface. The protective film has an interposed film portion between the first main electrodes. The conductive member has facing portions each facing a corresponding one of the first main electrodes and an interposed conductive portion disposed between the facing portions. The solder portions are disposed between the first main electrodes and the facing portions and separated away from each other by the interposed film portion and the interposed conductive portion to define a space between the solder portions. The interposed film portion and the interposed conductive portion are less likely wetted to the solder portions to avoid the solder portions in liquid phase entering into the space during soldering.

11 Claims, 17 Drawing Sheets

SEMICONDUCTOR DEVICE

CROSS REFERENCE TO RELATED APPLICATION

This application is based on Japanese Patent Application No. 2021-107963 filed on Jun. 29, 2021, the disclosure of which is incorporated herein by reference in its entirety.

TECHNICAL FIELD

The disclosure described in the present specification relates to a semiconductor device including a semiconductor element, a conductive member, and solder.

BACKGROUND ART

A semiconductor device includes a semiconductor substrate on which two emitter electrodes are formed, and a heat spreader fixed to each of the two emitter electrodes through solder.

SUMMARY

A semiconductor device according to one aspect of the present disclosure includes a semiconductor element, a conductive member and a plurality of solder portions. The semiconductor element includes a plurality of first main electrodes disposed on a first main surface, a second main electrode disposed on a second main surface opposite to the first main surface in a plate thickness direction, and a protective film disposed on the first main surface and having at least one interposed film portion disposed between the plurality of first main electrodes. The conductive member has a facing surface facing the first main surface in the plate thickness direction and has, on the facing surface, a plurality of facing portions each facing a corresponding one of the plurality of first main electrodes in the plate thickness direction, and at least one interposed conductive portion disposed between the plurality of facing portions in an arrangement direction in which the plurality of facing portions are arranged. The plurality of solder portions are disposed between the plurality of first main electrodes and the plurality of facing portions. The plurality of solder portions are separated away from each other by the at least one interposed film portion and the at least one interposed conductive portion to define a space between the plurality of solder portions. The at least one interposed film portion and the at least one interposed conductive portion are configured to be less likely wetted to the plurality of solder portions such that the at least one interposed film portion and the at least one interposed conductive portion avoid the plurality of solder portions in liquid phase entering into the space during soldering.

DESCRIPTION OF EMBODIMENTS

Figure 1:
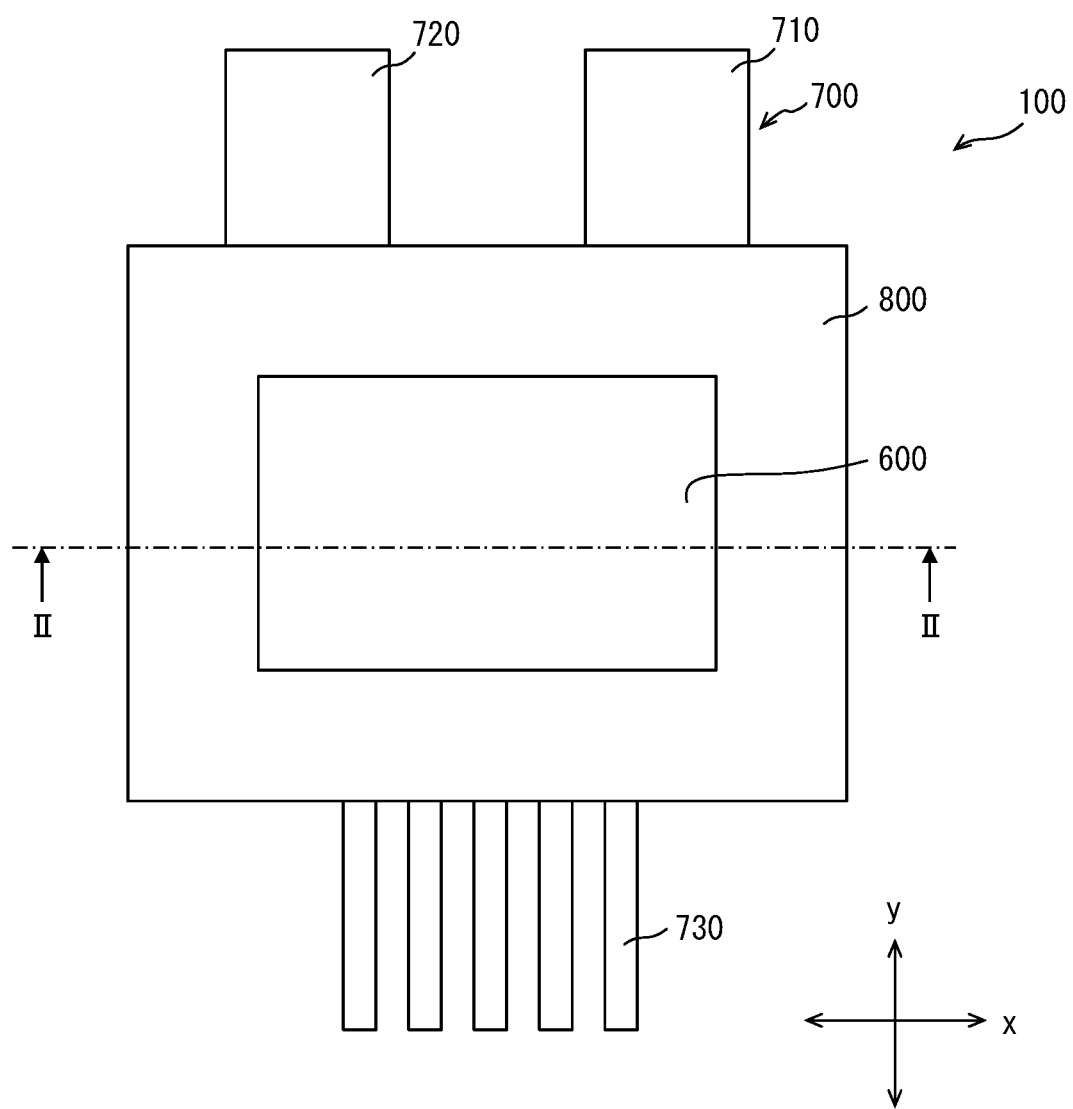
FIG. 1 is a schematic diagram illustrating a semiconductor device.

To begin with, examples of relevant techniques will be described.

A semiconductor device includes a semiconductor substrate on which two emitter electrodes are formed, and a heat spreader fixed to each of the two emitter electrodes through solder. A polyimide film is provided between the two emitter electrodes.

The polyimide film is less likely to be wetted to solder. The solder easily wet-spreads to the heat spreader side, and the solder is easily bridged between the semiconductor substrate and the heat spreader.

Thus, an object of the present disclosure is to provide a semiconductor device in which a solder portion is less likely to be bridged between a semiconductor element and a conductive member.

A semiconductor device according to one aspect of the present disclosure includes a semiconductor element, a conductive member and a plurality of solder portions. The semiconductor element includes a plurality of first main electrodes disposed on a first main surface, a second main electrode disposed on a second main surface opposite to the first main surface in a plate thickness direction, and a protective film disposed on the first main surface and having at least one interposed film portion disposed between the plurality of first main electrodes. The conductive member has a facing surface facing the first main surface in the plate thickness direction and has, on the facing surface, a plurality of facing portions each facing a corresponding one of the plurality of first main electrodes in the plate thickness direction, and at least one interposed conductive portion disposed between the plurality of facing portions in an arrangement direction in which the plurality of facing portions are arranged. The plurality of solder portions are disposed between the plurality of first main electrodes and the plurality of facing portions. The plurality of solder portions are separated away from each other by the at least one interposed film portion and the at least one interposed conductive portion to define a space between the plurality of solder portions. The at least one interposed film portion and the at least one interposed conductive portion are configured to be less likely wetted to the plurality of solder portions such that the at least one interposed film portion and the at least one interposed conductive portion avoid the plurality of solder portions in liquid phase entering into the space during soldering.

According to this, the plurality of solder portions are less likely to be bridged between the semiconductor element and the conductive member.

Hereinafter, a plurality of modes for implementing the present disclosure will be described with reference to the drawings. In each mode, portions corresponding to the matters described in the preceding modes are denoted by the same reference numerals, and redundant description may be omitted. When only a part of the configuration is described in each mode, another mode described precedingly can be applied to another part of the configuration.

In addition, not only the combination between portions explicitly described that the combination is possible in each embodiment, but also partial combinations between the embodiments, between the embodiment and the modification, and between the modifications can be made if there is no problem in the combination in particular even when not explicitly described.

First Embodiment

Hereinafter, a mechanical configuration of the semiconductor device 100 will be described. Three directions orthogonal to each other are defined as an x direction, a y direction, and a z direction. In the drawings, the description of "direction" is omitted. The plate thickness direction corresponds to the z direction. The arrangement direction corresponds to the x direction.

Figure 2:
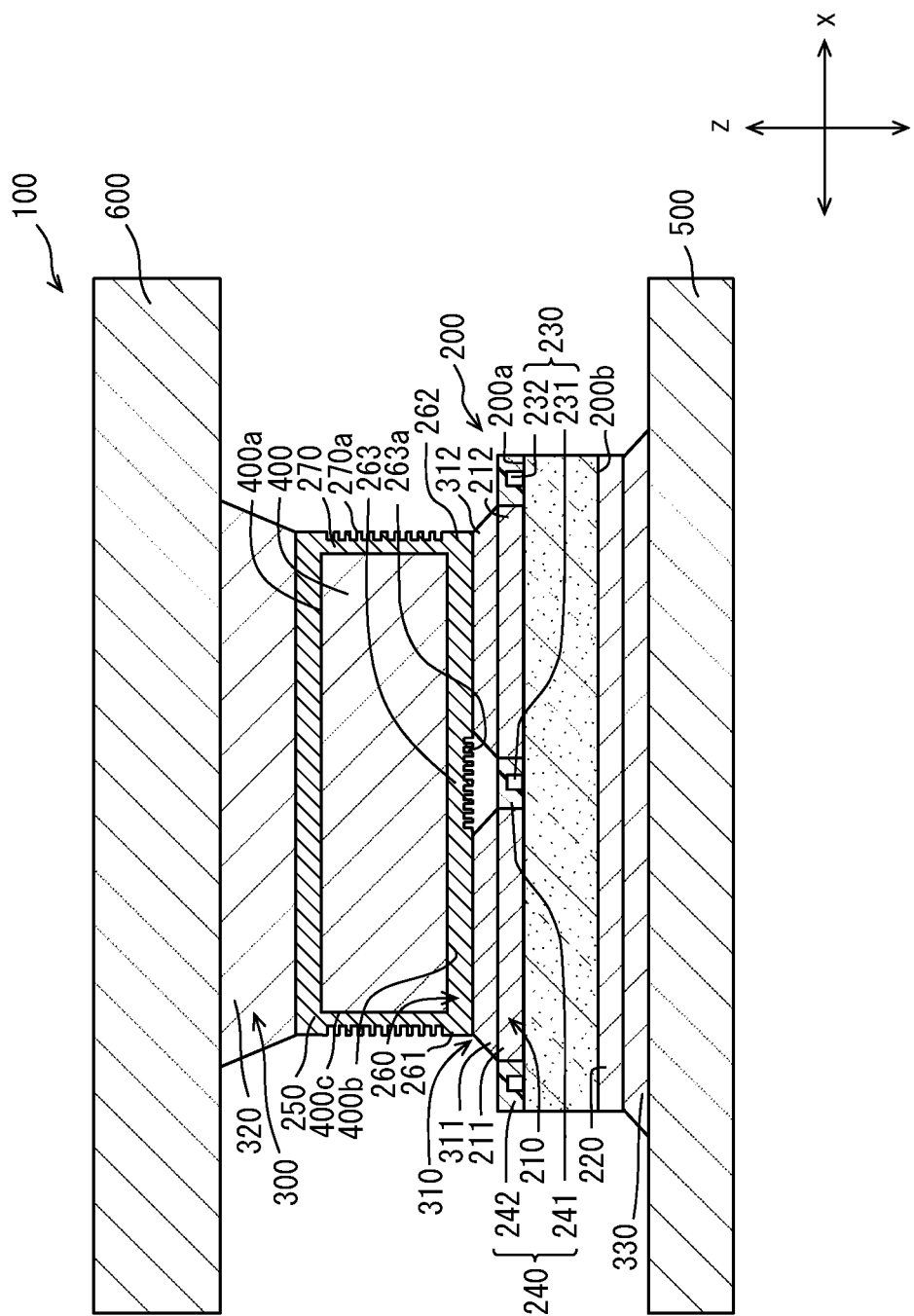
FIG. 2 is a cross-sectional view of the semiconductor device taken along line II-II shown in FIG. 1.

As illustrated in FIGS. 1 and 2, the semiconductor device 100 includes a semiconductor element 200, a solder 300, a terminal 400, a first heat sink 500, a second heat sink 600, a plurality of terminals 700, and a coating resin 800 coating these components. Specifically, the plurality of terminals 700 include a first main terminal 710, a second main terminal 720, and a plurality of signal terminals 730. In FIG. 2, the description of the coating resin 800 is omitted. The terminal 400 corresponds to a conductive member.

The semiconductor device 100 is known as what is called a 1-in-1 package constituting one of a plurality of arms constituting a three-phase inverter. The semiconductor device 100 is incorporated in, for example, an inverter circuit of a vehicle. The semiconductor device 100 is not limited to the 1-in-1 package as shown in FIG. 1. The semiconductor device 100 may be a 2-in-1 package.

The semiconductor element 200 is formed by forming a power transistor such as an insulated gate bipolar transistor (IGBT) on a semiconductor member such as silicon or silicon carbide. The power transistor has what is called a vertical structure so that a current flows in the z direction.

The semiconductor element 200 has a flat shape with a small thickness in the z direction. The semiconductor element 200 has a first main surface 200a and a second main surface 200b arranged spaced apart in the z direction. The second main surface 200b is opposite to the first main surface 200a in the plate thickness direction.

In addition, as shown in FIG. 2, the emitter electrode 210, the gate liner 230, and the protective film 240 are provided on the first main surface 200a. The emitter electrode 210 includes a first emitter electrode 211 and a second emitter electrode 212 that are separated away from each other by the protective film 240. The first emitter electrode 211 and the second emitter electrode 212 may be electrically connected through a base electrode (not shown). A collector electrode 220 is provided all over the second main surface 200b.

The first emitter electrode 211 and the second emitter electrode 212 correspond to a plurality of first main electrodes. The collector electrode 220 corresponds to a second main electrode. The gate liner 230 corresponds to a signal wiring line.

Figure 3:
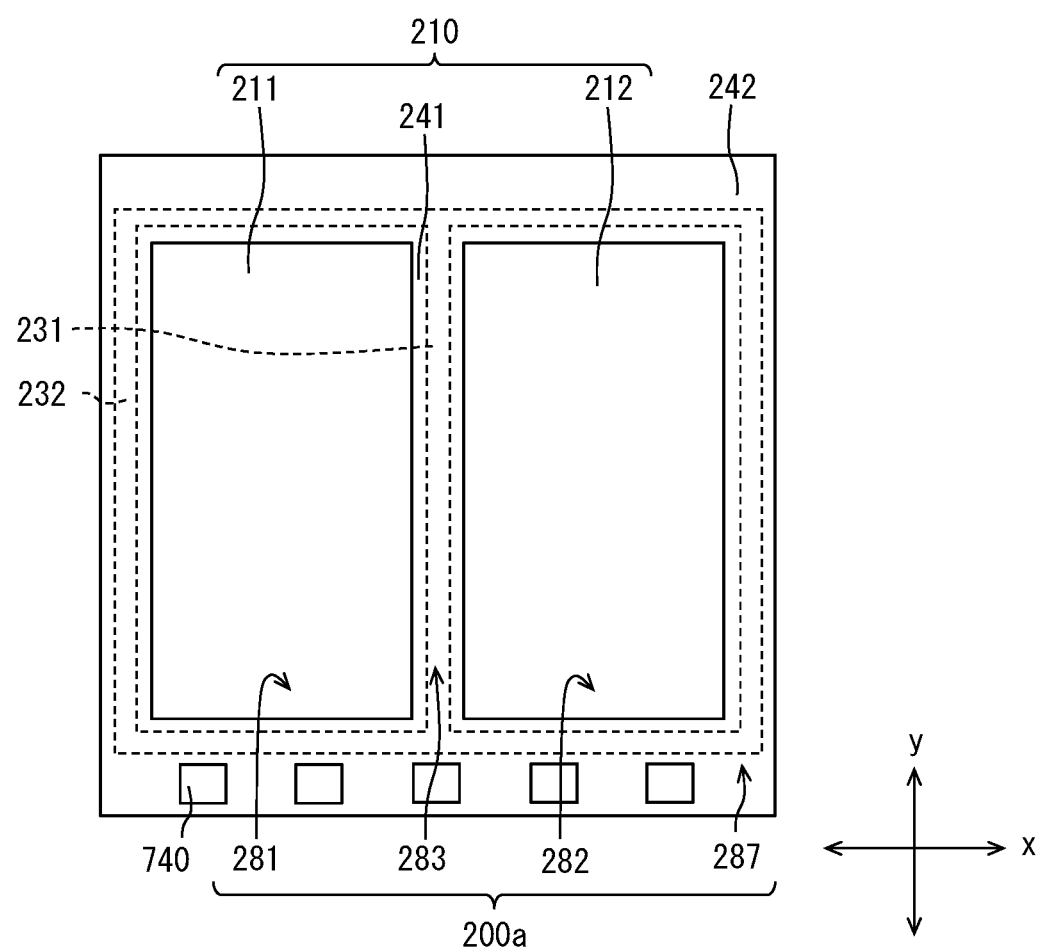
FIG. 3 is a top view of a semiconductor element.

In order to simplify the following description, the first main surface 200a is divided into a first region 281, a second region 282, a third region 283, and a first peripheral region 287 as shown in FIG. 3 to be described. Hereinafter, the first region 281 to the first peripheral region 287 will be specifically described.

As shown in FIG. 3, the first region 281 to the third region 283 are arranged at the center of the first main surface 200a. The first region 281 and the second region 282 are arranged to be separated from each other in the x direction. The third region 283 is provided between the first region 281 and the second region 282. The first peripheral region 287 is provided on the first main surface 200a in a mode of annularly surrounding the first region 281 to the third region 283 in the circumferential direction around the z direction.

As shown in FIG. 3, the first emitter electrode 211 is formed in the first region 281. The second emitter electrode 212 is formed in the second region 282. A part of the gate liner 230 and a part of the protective film 240 are provided in the third region 283.

Hereinafter, a part of the gate liner 230 provided in the third region 283 is referred to as a first gate liner 231. A part of the protective film 240 provided in the third region 283 is referred to as a first protective portion 241. The first gate liner 231 is coated and protected with the first protective portion 241. The first protective portion 241 corresponds to an interposed film portion.

In addition, in the first peripheral region 287, the rest of the gate liner 230, the rest of the protective film 240, and a plurality of pads 740 are provided. Hereinafter, the rest of the gate liner 230 provided in the first peripheral region 287 is referred to as a second gate liner 232. The rest of the protective film 240 provided in the first peripheral region 287 is referred to as a second protective portion 242. The second gate liner 232 is coated and protected with the second protective portion 242.

In FIG. 3, the gate liner 230 is indicated by a broken line in order to clarify the position of the gate liner 230.

The gate liner 230 is a wiring line whose resistance is reduced in order to transmit an on/off signal to a gate electrode of a power transistor formed in the semiconductor element 200 without delay.

The protective film 240 is a protective member made of a member containing polyimide for protecting the gate liner 230. The protective film 240 is less likely to be wetted to the solder 300 than the emitter electrode 210. More specifically, the first protective portion 241 and the second protective portion 242 are less likely to be wetted to the solder 300 than the first emitter electrode 211 and the second emitter electrode 212.

The plurality of pads 740 are signal electrodes. The plurality of pads 740 are provided, for example, on the end side in the y direction of the semiconductor element 200. The plurality of pads 740 are exposed from the second protective portion 242.

Each of the plurality of pads 740 is used, for example, for a gate electrode, a Kelvin emitter, a current sense, an anode potential of a temperature sensor, and a cathode potential of a temperature sensor. The plurality of pads 740 are electrically connected to the plurality of signal terminals 730 via bonding wires (not shown).

The terminal 400 is a conductive block body having a substantially rectangular parallelepiped shape. The terminal 400 is formed using a metal member having excellent thermal conductivity and electrical conductivity, such as copper.

As shown in FIG. 2, the terminal 400 has a first terminal surface 400a, a second terminal surface 400b opposite to the first terminal surface 400a, and four coupling terminal surfaces 400c that couple the first terminal surface 400a and the second terminal surface 400b, which are arranged to be separated from each other in the z direction. The second terminal surface 400b is provided closer to the first main surface 200a than the first terminal surface 400a in the z direction. The second terminal surface 400b corresponds to a facing surface.

First plating 250 is provided on the first terminal surface 400a. Second plating 260 is provided on the second terminal surface 400b. Third plating 270 is provided on the coupling terminal surfaces 400c.

Hereinafter, in order to specifically describe the second terminal surface 400b, the second terminal surface 400b will be divided into a fourth region 284, a fifth region 285, and a sixth region 286 to be described. Hereinafter, the fourth region 284 to the sixth region 286 will be specifically described.

Figure 4:
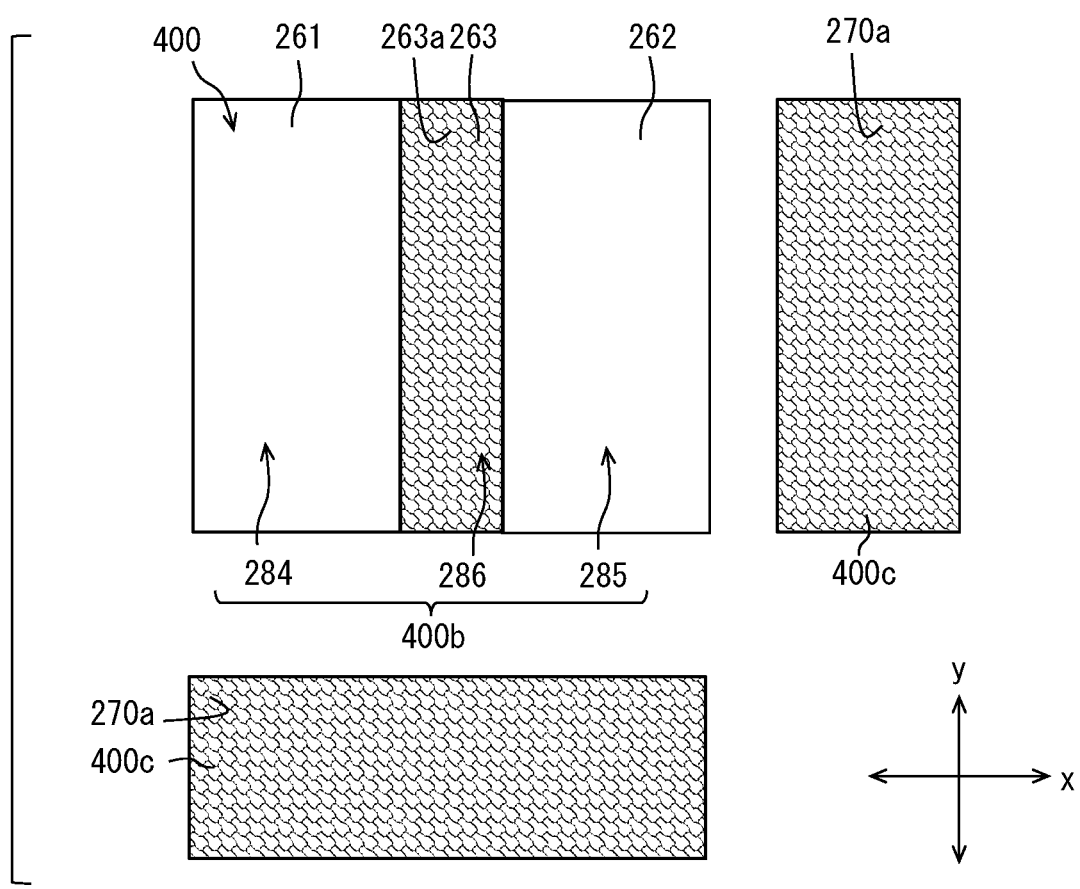
FIG. 4 is a trihedral figure of a terminal.

As shown in FIG. 4, the fourth region 284 and the fifth region 285 are arranged to be separated from each other in the x direction. The sixth region 286 is provided between the fourth region 284 and the fifth region 285.

The second plating 260 is provided in each of the fourth region 284 to the sixth region 286. In order to simplify the following description, the second plating 260 provided in the fourth region 284 is referred to as first facing plating 261. The second plating 260 provided in the fifth region 285 is referred to as second facing plating 262. The second plating 260 provided in the sixth region 286 is referred to as third facing plating 263. The front view in FIG. 4 is a front view of the terminal 400 as viewed from the second terminal surface 400b side.

The first facing plating 261 and the second facing plating 262 correspond to a plurality of facing portions. The third facing plating 263 corresponds to an interposed conductive portion.

Figure 5:
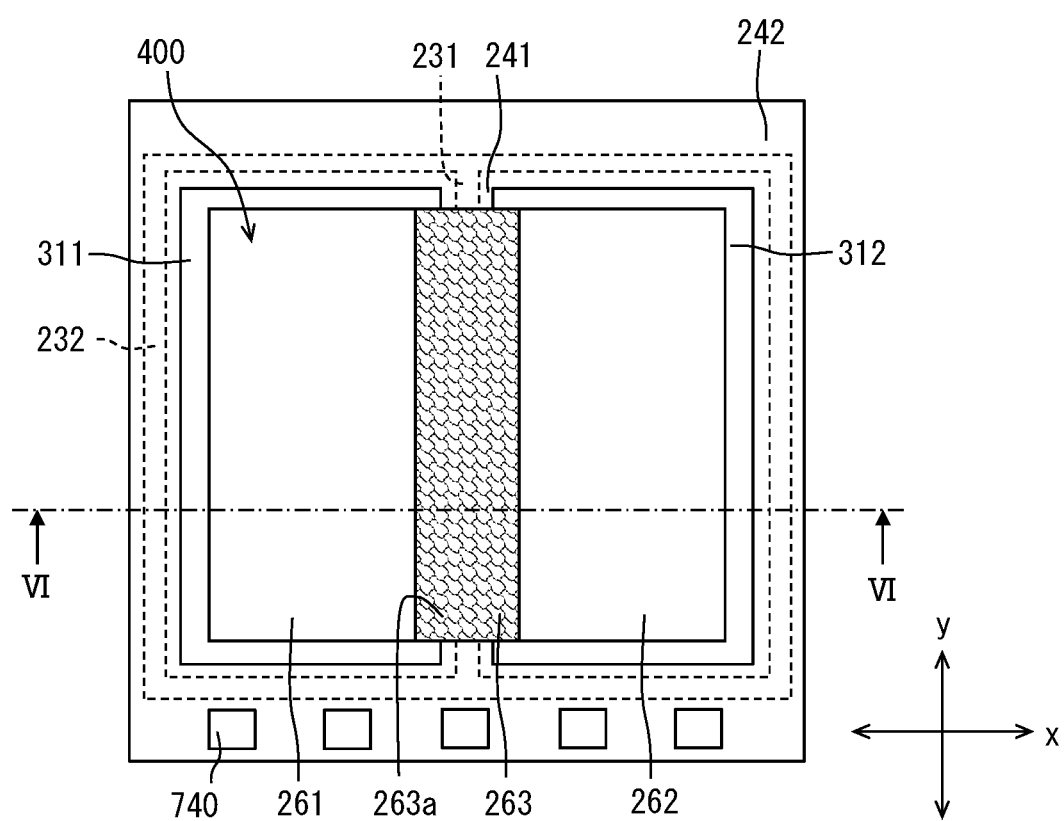
FIG. 5 is a top view in which a second terminal surface is superposed on the semiconductor element.

As shown in FIGS. 3 to 5, the fourth region 284 faces a part of the first region 281 in the z direction. The fifth region 285 faces a part of the second region 282 in the z direction. The sixth region 286 faces a part of the first region 281, a part of the second region 282, and the third region 283 in the z direction. In FIG. 5, a view in which the second terminal surface 400b is superposed on the semiconductor element 200 is shown in order to clarify a positional relationship between a first uneven portion 263a and the first protective portion 241 described below.

Accordingly, the first facing plating 261 faces a part of the first emitter electrode 211, in the z direction. The second facing plating 262 faces a part of the second emitter electrode 212, in the z direction. The third facing plating 263 faces a part of each of the first emitter electrode 211, the second emitter electrode 212, the first protective portion 241, and the first gate liner 231 in a mode of overlapping in the z direction.

Figure 6:
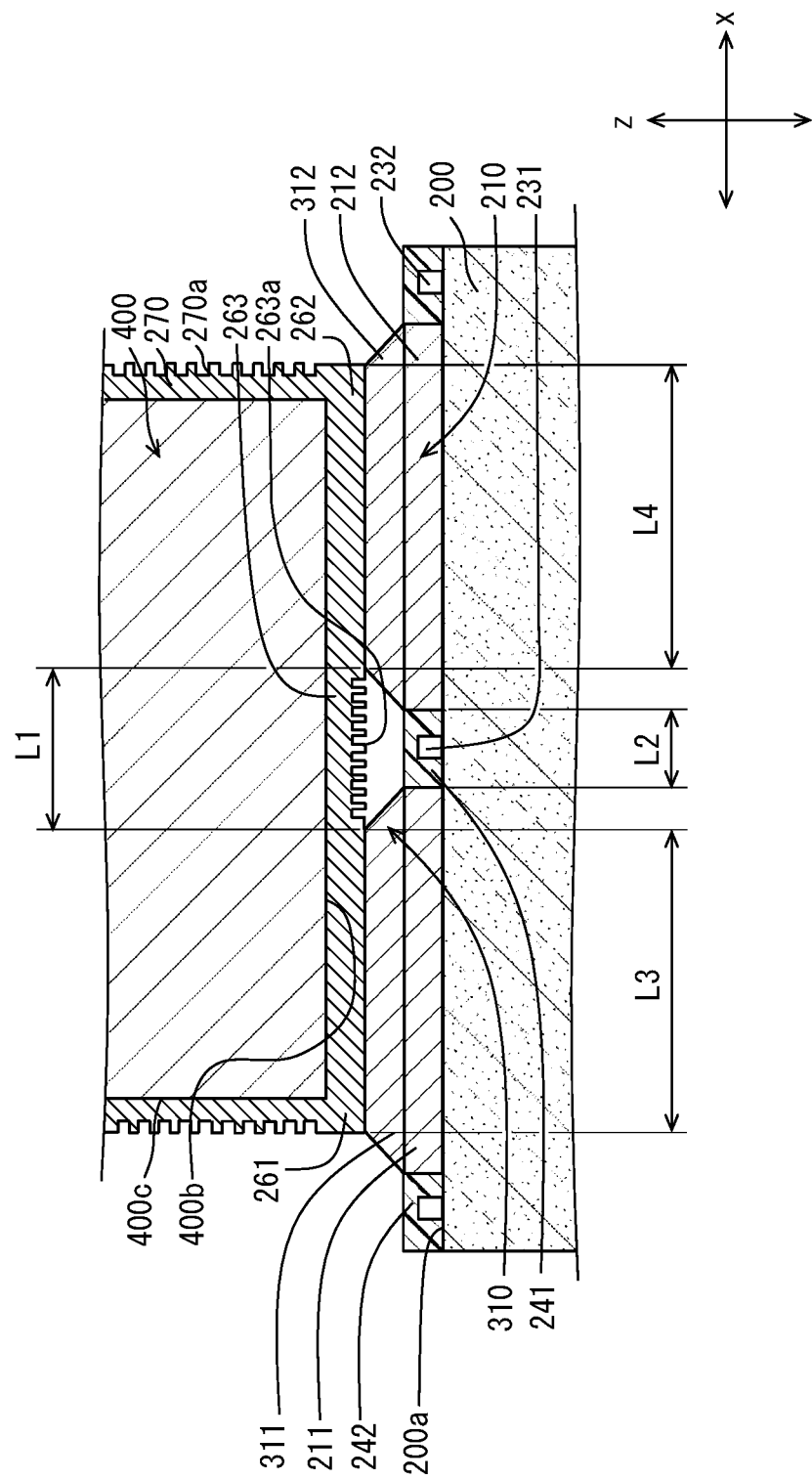
FIG. 6 is a cross-sectional view of the semiconductor device taken along line VI-VI shown in FIG. 5.

In addition, as shown in FIG. 6, the first uneven portion 263a uneven in the z direction is formed on the surface of the third facing plating 263 facing the first protective portion 241. The first uneven portion 263a is consecutively formed on the surface of the third facing plating 263 facing the first protective portion 241. The first uneven portion 263a corresponds to an uneven surface.

The first uneven portion 263a is formed by irradiating the surface of the third facing plating 263 facing the first protective portion 241 with a laser beam. The surface of the third facing plating 263 facing the first protective portion 241 is melted and vaporized when irradiated with a laser beam. The first uneven portion 263a is formed on the surface by making the irradiated portion recessed. The third facing plating 263 has a melting point lower than that of the terminal 400. A temperature exceeding the melting point of the third facing plating 263 is applied by a laser beam. Thus, the third facing plating 263 is melted.

The third facing plating 263 has low wettability due to the formation of the first uneven portion 263a on the surface. Therefore, the first uneven portion 263a is less likely to be wetted to the solder 300 than each of the first facing plating 261 and the second facing plating 262. More specifically, the first uneven portion 263a is less likely to be wetted to the first solder portion 311 described below and the second solder portion 312 described below than the first facing plating 261 and the second facing plating 262.

In addition, similarly to the third facing plating 263, the third plating 270 is also formed with a second uneven portion 270a uneven in a direction orthogonal to the coupling terminal surface 400c. The second uneven portion 270a is consecutively formed on a surface of the third plating 270 facing away from the coupling terminal surface 400c.

The third plating 270 has low wettability due to the formation of the second uneven portion 270a on the surface. Therefore, the second uneven portion 270a is less likely to be wetted to the solder 300 than each of the first plating 250, the first facing plating 261, and the second facing plating 262. More specifically, the second uneven portion 270a is less likely to be wetted to the second solder 320, the first solder portion 311 described below, and the second solder portion 312 described below than the first plating 250, the first facing plating 261, and the second facing plating 262. Details of the solder 300 will be described below.

Next, the heat sink will be described. As shown in FIG. 2, the first heat sink 500 has a flat shape small in thickness in the z direction. The first heat sink 500 is provided on the second main surface 200b side of the semiconductor element 200.

A first main terminal 710 shown in FIG. 1 is connected to the first heat sink 500. The first main terminal 710 is a terminal 700 electrically connected to the collector electrode 220 of the semiconductor element 200.

The first heat sink 500 has a heat dissipation function of dissipating heat of a transistor formed in the semiconductor element 200 to the outside of the semiconductor element 200, and a function of electrically joining the collector electrode 220 and the first main terminal 710. Similarly to the terminal 400, the first heat sink 500 is formed using a metal member excellent in thermal conductivity and electrical conductivity, such as copper.

Similarly, the second heat sink 600 has a flat shape with a small thickness in the z direction. As shown in FIG. 2, the second heat sink 600 is provided on the first main surface 200a side of the semiconductor element 200.

The second main terminal 720 is connected to the second heat sink 600. The second main terminal 720 is a terminal 700 electrically connected to the emitter electrode 210 of the semiconductor element 200.

The second heat sink 600 has a heat dissipation function of dissipating heat of a transistor formed in the semiconductor element 200 to the outside of the semiconductor element 200, and a function of electrically joining the emitter electrode 210 and the second main terminal 720. Similarly to the terminal 400 and the first heat sink 500, the second heat sink 600 is formed using a metal member excellent in thermal conductivity and electrical conductivity, such as copper.

Next, the solder 300 will be described. The solder 300 includes a first solder 310, a second solder 320, and a third solder 330.

The first solder 310 is provided between the emitter electrode 210 and the second plating 260. More specifically, the first solder 310 includes the first solder portion 311 provided between the first emitter electrode 211 and the first facing plating 261 and the second solder portion 312 provided between the second emitter electrode 212 and the second facing plating 262. A space is defined between the first solder portion 311 and the second solder portion 312. The first solder portion 311 and the second solder portion 312 correspond to a plurality of solder portions.

The first emitter electrode 211 and the first facing plating 261 are electrically and mechanically joined through the first solder portion 311. The second emitter electrode 212 and the second facing plating 262 are electrically and mechanically joined through the second solder portion 312.

The second solder 320 is provided between the first plating 250 and the second heat sink 600. The first plating 250 and the second heat sink 600 are electrically and mechanically joined through the second solder 320.

The third solder 330 is provided between the collector electrode 220 and the first heat sink 500. The collector electrode 220 and the first heat sink 500 are electrically and mechanically joined through the third solder 330.

<Contact Angle of First Solder>

The first uneven portion 263a has one end closer to the first emitter electrode 211 than to the second emitter electrode 212. The first protective portion 241 has one end in the x direction closer to the first emitter electrode 211. As shown in FIGS. 5 and 6, the one end of the first uneven portion 263a is positioned on a side of the one end of the first protective portion 241 closer to the first emitter electrode 211 in the x direction.

The other end of the first uneven portion 263a closer to the second emitter electrode 212 is positioned on a side of the other end of the first protective portion 241 closer to the second emitter electrode 212 in the x direction.

A length L1 in the x direction of the first uneven portion 263a is longer than a length L2 in the x direction of the first protective portion 241.

Furthermore, a projected area onto which the first uneven portion 263a is projected toward the first main surface 200a in the z direction includes the whole portion of the first protective portion 241 facing the terminal 400 in the z direction.

As described above, the first uneven portion 263a and the first protective portion 241 are less likely to be wetted to each of the first solder portion 311 and the second solder portion 312.

Therefore, as shown in FIG. 6, the contact angle between a portion of the first solder portion 311 close to the first protective portion 241 and the first emitter electrode 211 is an acute angle. The contact angle between a portion of the second solder portion 312 close to the first protective portion 241 and the second emitter electrode 212 is an acute angle.

In addition, as shown in FIGS. 5 and 6, the whole terminal 400 is included in a projected area onto which the semiconductor element 200 is projected in the z direction. Furthermore, the whole terminal 400 is included in a projected area onto which the combined region of the first emitter electrode 211, the second emitter electrode 212, and the first protective portion 241 in the semiconductor element 200 is projected in the z direction.

As described above, on each of the four coupling terminal surfaces 400c coupling the first terminal surface 400a and the second terminal surface 400b, the second uneven portion 270a less likely to be wetted to each of the first solder portion 311, the second solder portion 312, and the second solder 320 is formed.

Therefore, as shown in FIG. 6, the contact angle between a portion of the first solder portion 311 close to the second protective portion 242 and the first emitter electrode 211 is an acute angle. The contact angle between a portion of the second solder portion 312 close to the second protective portion 242 and the second emitter electrode 212 is an acute angle.

Each of the first solder portion 311 and the second solder portion 312 forms a substantially quadrangular pyramid frustum. The first protective portion 241 and the first uneven portion 263a avoid the first solder portion 311 and the second solder portion 312 in liquid phase entering into the space between the first solder portion 311 and the second solder portion 312 during soldering. That is, the first solder 310 is partitioned into the first solder portion 311 and the second solder portion 312 by the first protective portion 241 and the first uneven portion 263a.

Therefore, the first solder portion 311 and the second solder portion 312 are less likely to be bridged. The first solder portion 311 and the second solder portion 312 are less likely to be electrically and mechanically joined with each other.

<Electrical Resistance of Conductive Path Between First Heat Sink and Second Heat Sink>

As shown in FIG. 2, the first heat sink 500 and the second heat sink 600 are electrically connected through the first solder 310, the semiconductor element 200, the second solder 320, the terminal 400, and the third solder 330.

In addition, as described above, the first uneven portion 263a is less likely to be wetted to each of the first solder portion 311 and the second solder portion 312. The first solder portion 311 and the second solder portion 312 are less likely to be electrically and mechanically joined to the portion of the terminal where the first uneven portion 263a is provided.

Therefore, the current flowing between the first terminal surface 400a and the second terminal surface 400b is less likely to flow in the portion of the terminal 400 where the first uneven portion 263a is provided. The electrical resistance between the first terminal surface 400a and the second terminal surface 400b is high.

As a contrivance for this, as shown in FIG. 6, the sum of a length L3 in the x direction of the first facing plating 261 and a length L4 in the x direction of the second facing plating 262 is larger than the length L1 in the x direction of the first uneven portion 263a. According to this, the electric resistance between the first terminal surface 400a and the second terminal surface 400b is likely to be prevented from becoming too high. Furthermore, the length L1 in the x direction of the first uneven portion 263a may be less than each of the length L3 in the x direction of the first facing plating 261 and the length L4 in the x direction of the second facing plating 262.

Second Embodiment

In the first embodiment, a mode in which the emitter electrode 210 is partitioned into two by the first protective portion 241 has been described, but the emitter electrode 210 may be partitioned into two or more by a plurality of first protective portions 241 extending in the y direction. Accordingly, the first gate liner 231 may be coated and protected with each of the plurality of first protective portions 241.

Figure 7:
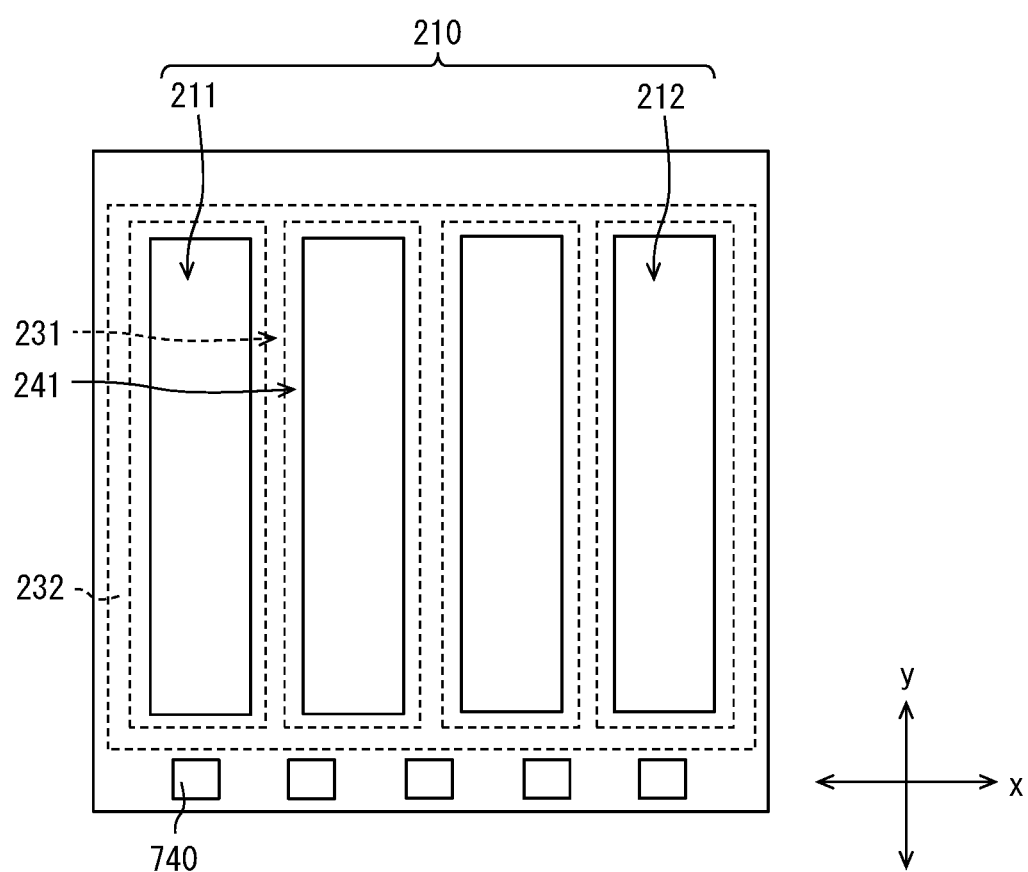
FIG. 7 is a top view for illustrating a modification of the semiconductor element.
Figure 8:
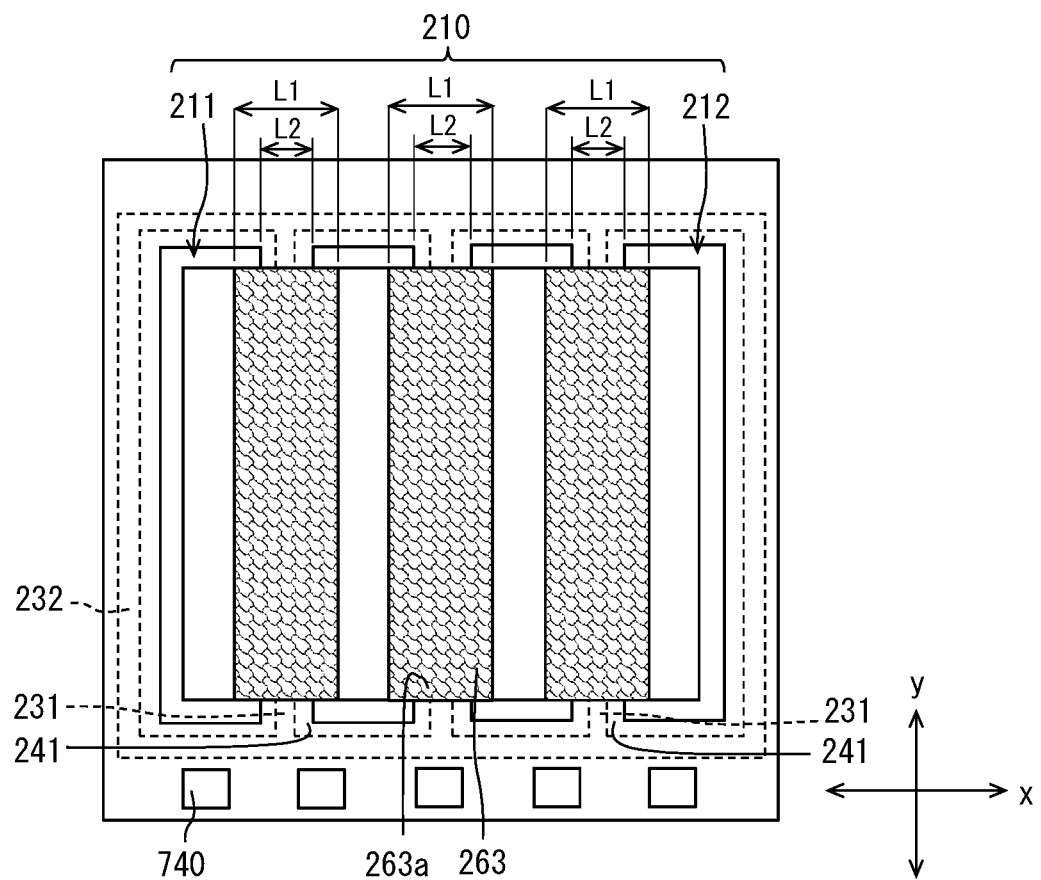
FIG. 8 is a top view of the modification in which a second terminal surface is superposed on the semiconductor element.

As shown in FIGS. 7 and 8, in the second embodiment, each of the first emitter electrode 211 and the second emitter electrode 212 is further partitioned into two in the x direction by one of the plurality of first protective portions 241.

The first gate liner 231 is routed to one of the first protective portions 241 between the partitioned portions of the first emitter electrode 211 in the x direction.

Similarly, the first gate liner 231 is routed to one of the first protective portions 241 between the partitioned portions of the second emitter electrode 212 in the x direction.

Furthermore, as shown in FIG. 8, a plurality of first uneven portions 263a being uneven in the z direction and consecutive are formed in portions of the second terminal surface 400b facing the plurality of first protective portions 241 in in the z direction. In FIG. 8, a view in which the second terminal surface 400b is superposed on the semiconductor element 200 is shown in order to clarify a positional relationship between the first uneven portions 263a and the first protective portions 241.

The length L1 in the x direction of each of the plurality of first uneven portions 263a is longer than the length L2 in the x direction of each of the plurality of first protective portions 241. Therefore, also in the second embodiment, the same functions and effects as those of the first embodiment can be produced.

In the second embodiment, an example in which the emitter electrode 210 is partitioned into four in the x direction by the plurality of first protective portions 241 has been specifically described, but the number of partitioned emitter electrodes 210 is not limited to four. The emitter electrode 210 may be partitioned into four or more in the x direction.

Third Embodiment

Figure 9:
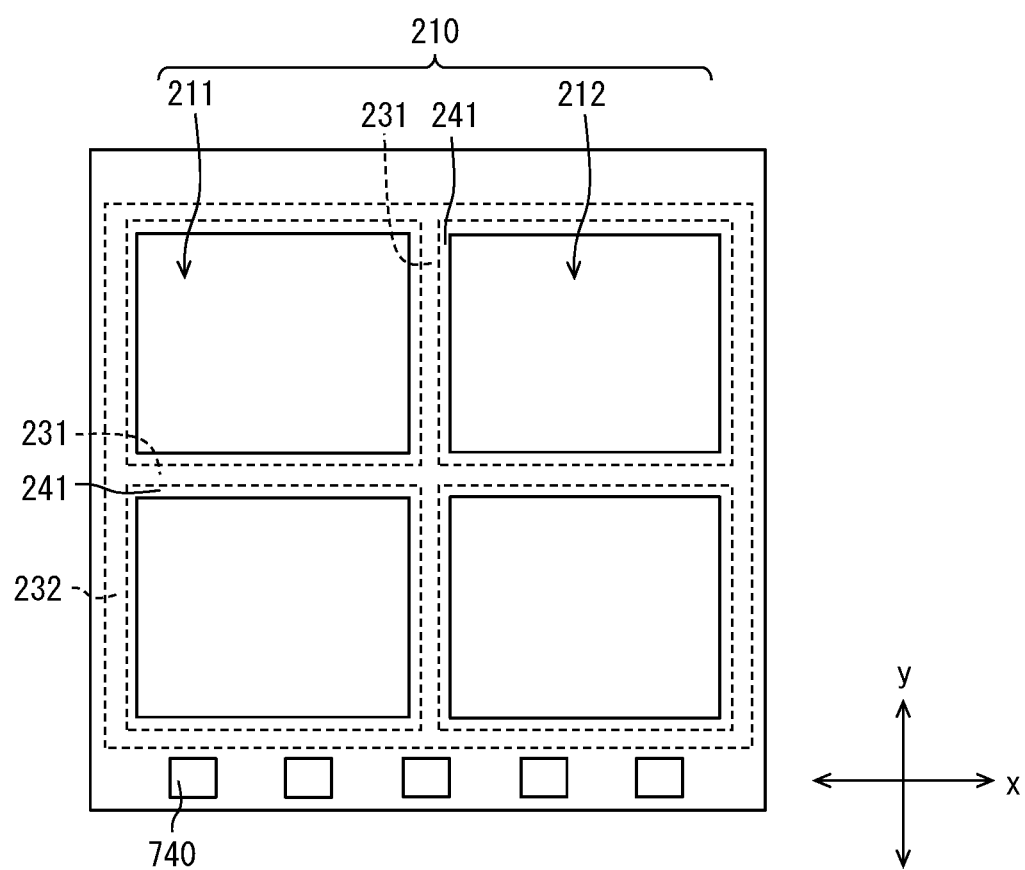
FIG. 9 is a top view for illustrating a modification of the semiconductor element.
Figure 10:
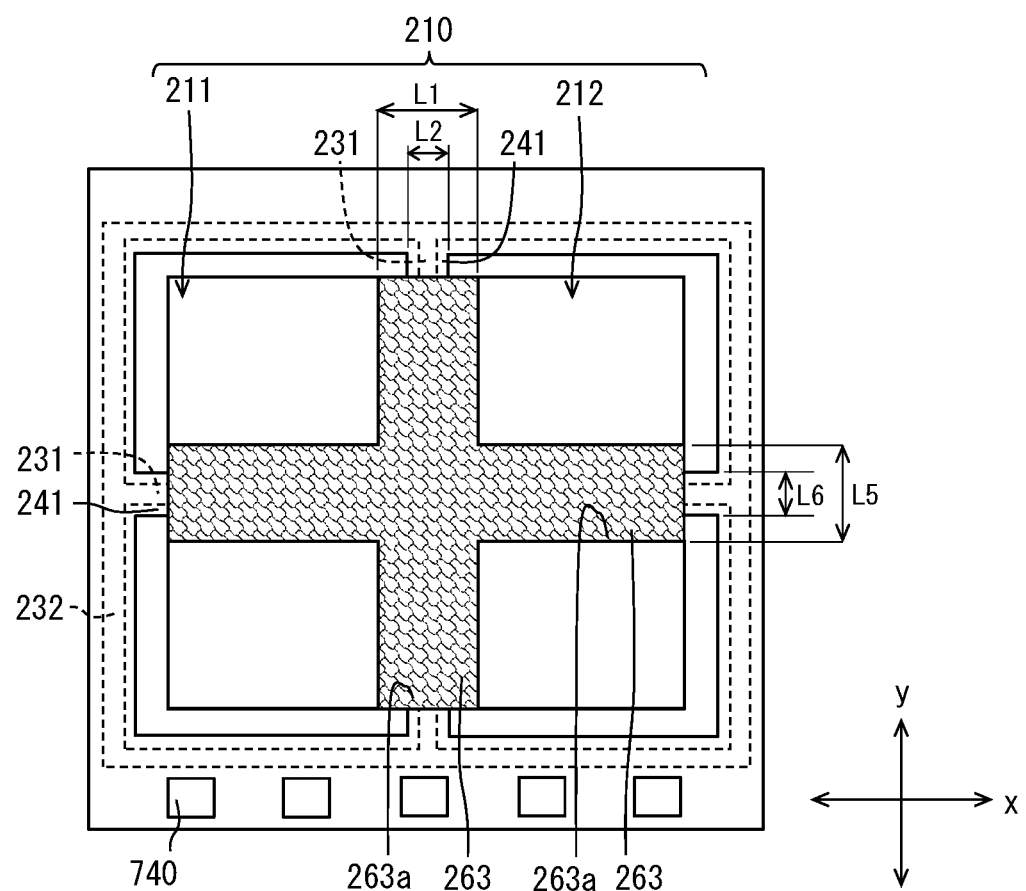
FIG. 10 is a top view of the modification in which a second terminal surface is superposed on the semiconductor element.

In addition, as in a third embodiment shown in FIGS. 9 and 10, in addition to the first protective portion 241 consecutive in the y direction, the first protective portion 241 consecutive in the x direction may be provided. Each of the first emitter electrode 211 and the second emitter electrode 212 may be further partitioned into two in the y direction by the first protective portion 241 consecutive in the x direction. Accordingly, the first gate liner 231 may be coated and protected with the first protective portion 241 consecutive in the x direction.

In addition, as shown in FIG. 10, the first uneven portions 263a consecutive in the x direction is formed in a portion of the second terminal surface 400b facing in the z direction the first protective portion 241 consecutive in the x direction, and the first uneven portion 263a consecutive in the y direction is formed in a portion of the second terminal surface 400b facing in the z direction the first protective portion 241 consecutive in the y direction. In FIG. 10, a view in which the second terminal surface 400b is superposed on the semiconductor element 200 is shown in order to clarify a positional relationship between the first uneven portions 263a and the first protective portions 241.

The length L1 in the x direction of the first uneven portion 263a consecutive in the y direction is longer than the length L2 in the x direction of the first protective portion 241 consecutive in the y direction. The length L5 in the y direction of the first uneven portion 263a consecutive in the x direction is longer than the length L6 in the y direction between both ends of the first protective portion 241 consecutive in the x direction. Therefore, also in the third embodiment, the same functions and effects as those of the first embodiment can be produced.

Fourth Embodiment

Figure 11:
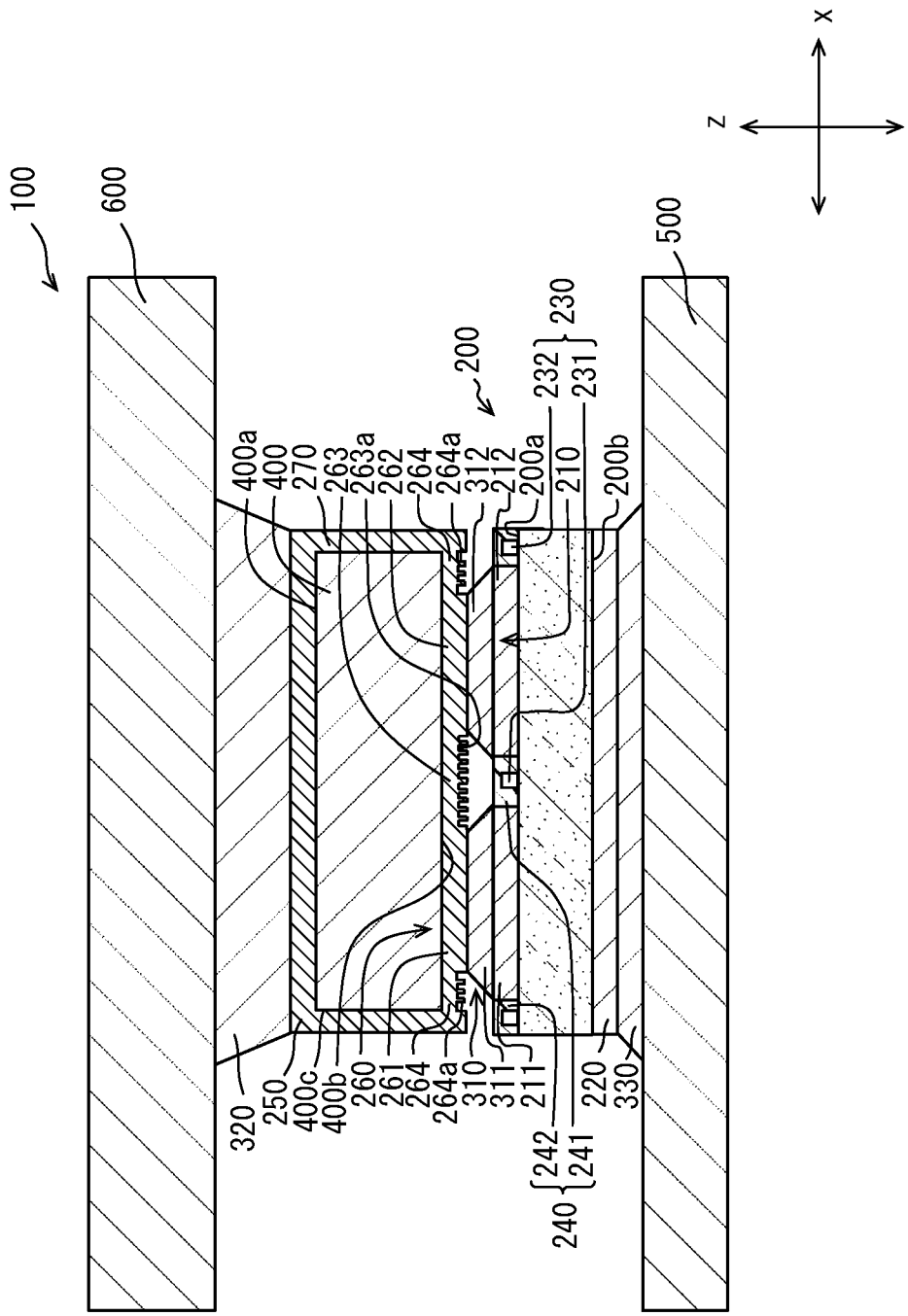
FIG. 11 is a cross-sectional view for illustrating a modification of the semiconductor device.
Figure 12:
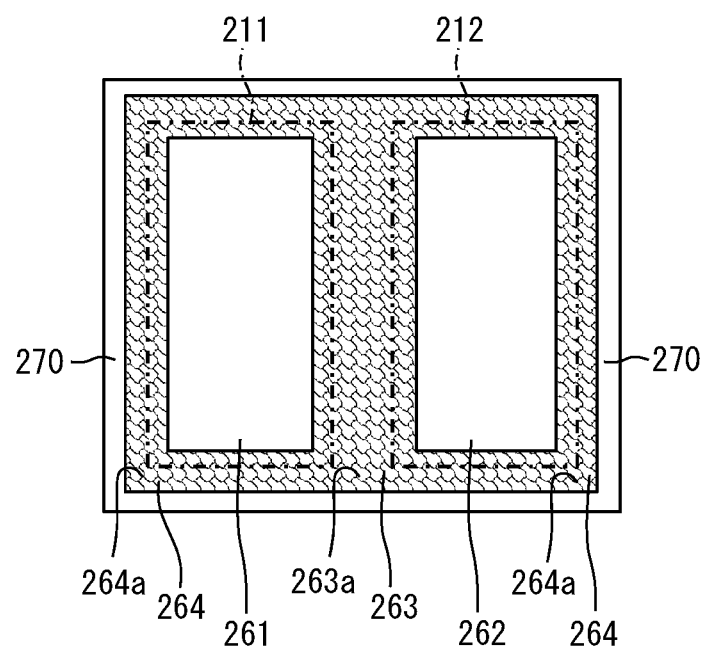
FIG. 12 is a top view for illustrating the modification of the terminal.

In the first to third embodiments, a mode in which the projected area in the z direction of the first uneven portion 263a includes the whole portion of the first protective portion 241 facing the terminal 400 has been described. However, as shown in the fourth embodiment shown in FIGS. 11 and 12, the whole first protective portion 241 may be included in the projected area in the z direction of the first uneven portion 263a. FIG. 12 shows a view in which the outlines of the first emitter electrode 211 and the second emitter electrode 212 are superposed on the second terminal surface 400b.

In this case, the projected area in the z direction of the terminal 400 includes the whole semiconductor element 200. Furthermore, the second terminal surface 400b is provided with a fourth facing plating 264 that annularly surrounds the combined portion of the first facing plating 261, the second facing plating 262, and the third facing plating 263.

The fourth facing plating 264 is formed with a third uneven portion 264a uneven in the z direction. The third uneven portion 264a is consecutively formed on the surface of the fourth facing plating 264 facing the second protective portion 242. The third uneven portion 264a is less likely to be wetted to the first solder portion 311 and the second solder portion 312 than the first facing plating 261 and the second facing plating 262.

Therefore, the contact angle between a portion of the first solder portion 311 close to the coupling terminal surface 400c and the first emitter electrode 211 is an acute angle. The contact angle between a portion of the second solder portion 312 close to the coupling terminal surface 400c and the second emitter electrode 212 is an acute angle. Even when the second uneven portion 270a is not formed on the coupling terminal surface 400c, each of the first solder portion 311 and the second solder portion 312 forms a substantially quadrangular pyramid frustum. The same functions and effects as those of the first embodiment can be produced also in the fourth embodiment.

<Functions and Effects>

As described above, the first uneven portion 263a and the first protective portion 241 are less likely to be wetted to each of the first solder portion 311 and the second solder portion 312, so that the first solder 310 is partitioned into the first solder portion 311 and the second solder portion 312.

Therefore, the first solder portion 311 and the second solder portion 312 are less likely to be bridged between the semiconductor element 200 and the terminal 400. Accordingly, the thickness in the z direction of the first solder 310 is likely to be prevented from being locally reduced.

According to this, stress concentration on the first solder 310 is likely to be suppressed. Occurrence of cracks is likely to be suppressed in the first solder 310.

As described above, the projected area in the z direction of the first uneven portion 263a includes the whole portion of the first protective portion 241 facing the terminal 400 in the z direction.

The length L1 in the x direction of the first uneven portion 263a is longer than the length L2 in the x direction of the first protective portion 241.

Therefore, each of the contact angle between the portion of the first solder portion 311 close to the first protective portion 241 and the first emitter electrode 211 and the contact angle between the portion of the second solder portion 312 close to the first protective portion 241 and the second emitter electrode 212 is an acute angle.

In addition, when the contact angle between the semiconductor element 200 and the solder 300 provided on the semiconductor element 200 is an acute angle, the stress applied to the semiconductor element 200 is likely to be smaller than that when the contact angle is an obtuse angle.

According to this, the stress applied from the first solder portion 311 to the first emitter electrode 211 is likely to be reduced. Occurrence of cracks is likely to be suppressed in the first emitter electrode 211.

Similarly, the stress applied from the second solder portion 312 to the second emitter electrode 212 is likely to be reduced. Occurrence of cracks is likely to be suppressed in the second emitter electrode 212.

In summary, the stress applied from the first solder 310 to the emitter electrode 210 is likely to be reduced. Occurrence of cracks is likely to be suppressed in the emitter electrode 210.

As described above, the first uneven portion 263a is less likely to be wetted to each of the first solder portion 311 and the second solder portion 312. When there is a region not wetted to the first solder 310 as in the first uneven portion 263a, electric resistance and thermal resistance between the first terminal surface 400a and the second terminal surface 400b increase.

As a contrivance for this, the sum of the length L3 in the x direction of the first facing plating 261 and the length L4 in the x direction of the second facing plating 262 is longer than the length L1 in the x direction of the first uneven portion 263a. According to this, electric resistance and thermal resistance between the first terminal surface 400a and the second terminal surface 400b are likely to be prevented from becoming too high.

As described above, on the surface of the third plating 270 facing away from the coupling terminal surfaces 400c, the second uneven portion 270a less likely to be wetted to each of the first solder 310 and the second solder 320 is formed.

Therefore, the first solder 310 and the second solder 320 are less likely to wet and spread over the coupling terminal surfaces 400c toward each other.

Accordingly, for example, it is possible to restrict the second solder 320 from flowing into the first solder 310, thereby avoiding the amount of the first solder 310 increasing. Thus, the occurrence of cracks in the emitter electrode 210 due to stress generated by the increase in the amount of the first solder 310 can be suppressed.

(First Modification)

In the embodiments described so far, the contact angle between the emitter electrode 210 and each of the first solder portion 311 and the second solder portion 312 has been described focusing on the length relationship between the length L1 in the x direction of the first uneven portion 263a and the length L2 in the x direction of the first protective portion 241.

Figure 13:
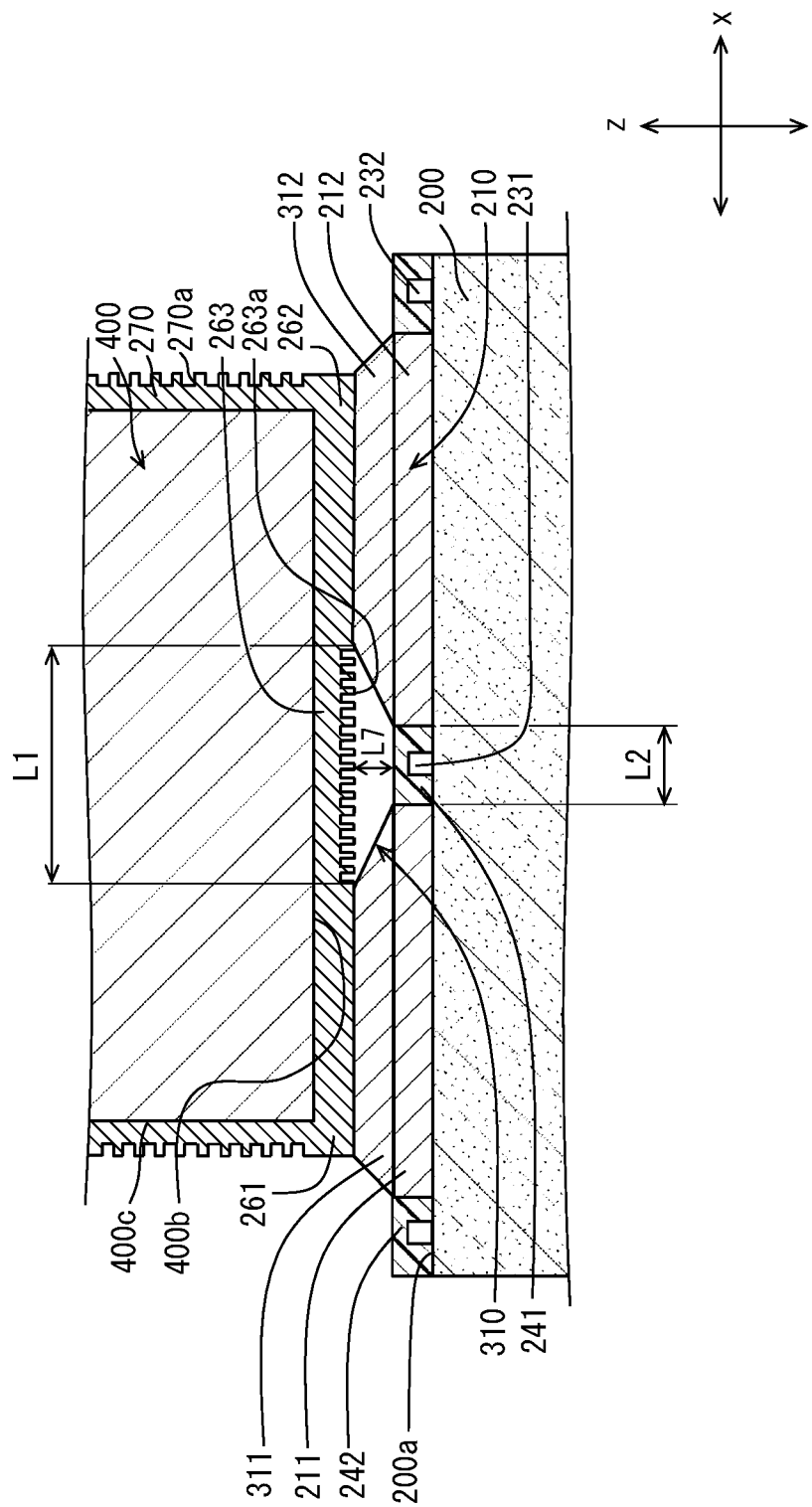
FIG. 13 is a cross-sectional view for illustrating a modification of the semiconductor device.

However, in another case, as shown in FIG. 13, the length L1 in the x direction of the first uneven portion 263a may be equal to or longer than the sum of the length L2 in the x direction of the first protective portion 241 and twice the separation distance L7 in the z direction between the first uneven portion 263a and the first protective portion 241.

According to this, the contact angle between the portion of the first solder portion 311 close to the first protective portion 241 and the first emitter electrode 211 is likely to be 45 degrees or less. The contact angle between the portion of the second solder portion 312 close to the first protective portion 241 and the second emitter electrode 212 is likely to be 45 degrees or less.

Figure 14:
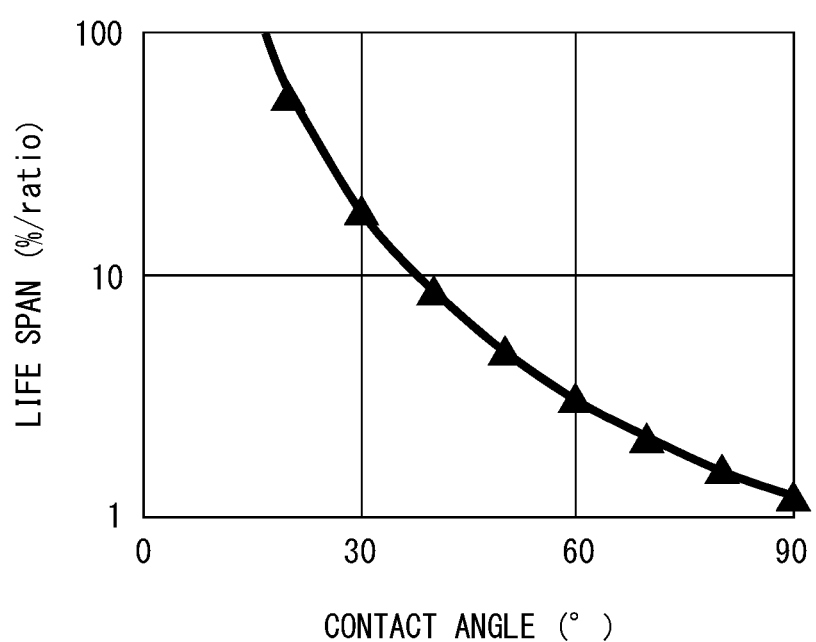
FIG. 14 is a correlation diagram for illustrating the correlation between the contact angle of solder and the life span of the semiconductor element.

In addition, as shown in FIG. 14, the more the contact angle between the semiconductor element 200 and the solder 300 provided on the semiconductor element 200 is reduced, the longer the life span of the semiconductor element 200 extends.

According to this, when the contact angle between the first solder portion 311 and the first emitter electrode 211 and the contact angle between the second solder portion 312 and the second emitter electrode 212 are 45 degrees or less, the life span of the semiconductor element 200 can be extended by about one digit.

(Second Modification)

Figure 15:
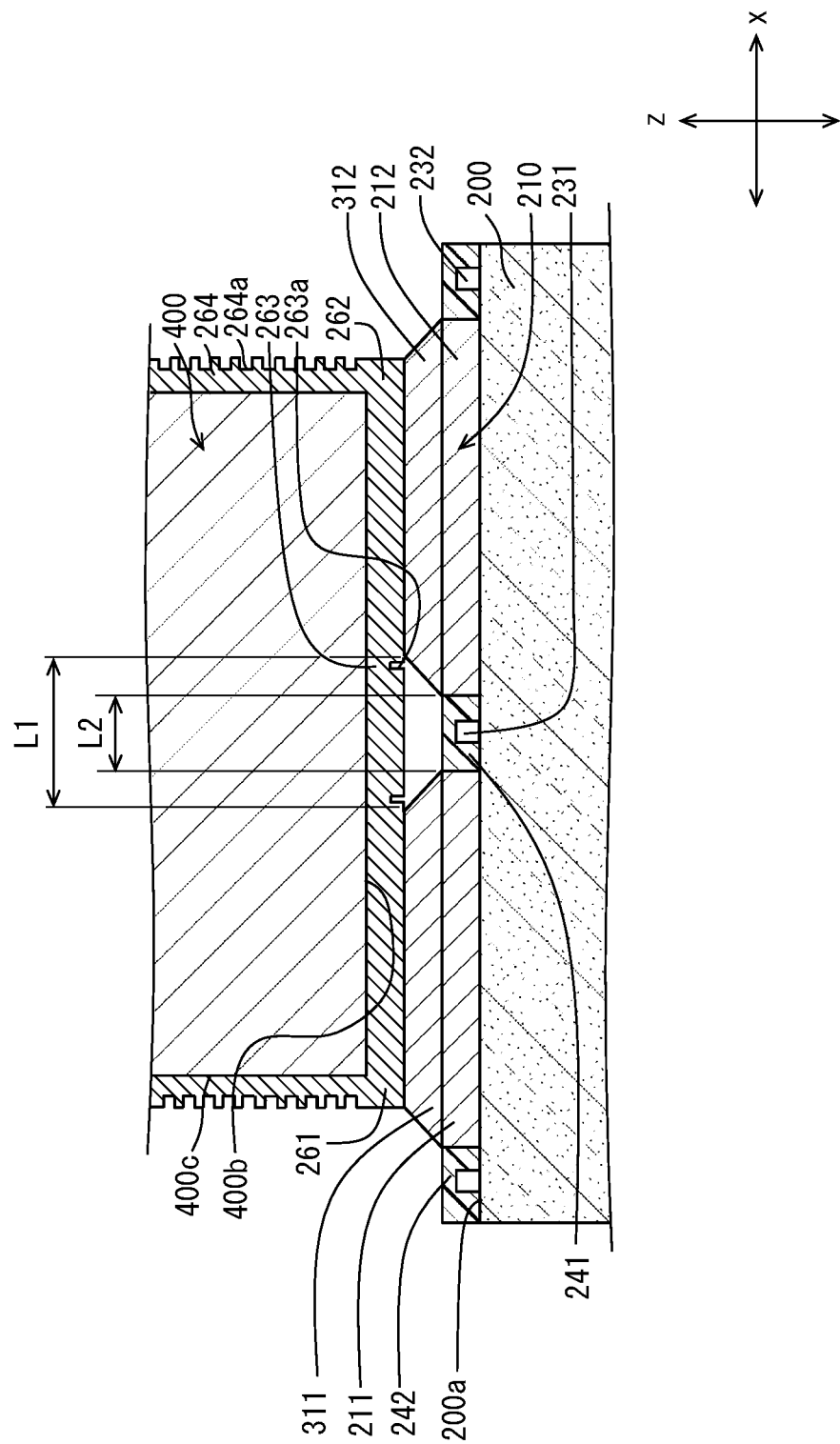
FIG. 15 is a cross-sectional view for illustrating a modification of the semiconductor device.

In the embodiments described above, a mode in which the projected area of the first uneven portion 263a in the z direction includes the portion of the first protective portion 241 facing the terminal 400 has been described. However, as shown in FIG. 15, the first protective portion 241 does not need to be included in the projected area of the first uneven portion 263a in the z direction. As shown in FIG. 15, the first uneven portion 263a may be partially formed on both ends of the third facing plating 263 close to the first facing plating 261 and the second facing plating 262.

That is, as shown in FIG. 15, the first solder 310 has only to be partitioned into the first solder portion 311 and the second solder portion 312 by the first protective portion 241 and the first uneven portion 263a. When the first solder portion 311 and the second solder portion 312 are separated from each other, it is possible to prevent the thickness of the first solder 310 from becoming locally reduced in the z direction.

(Third Modification)

Figure 16:
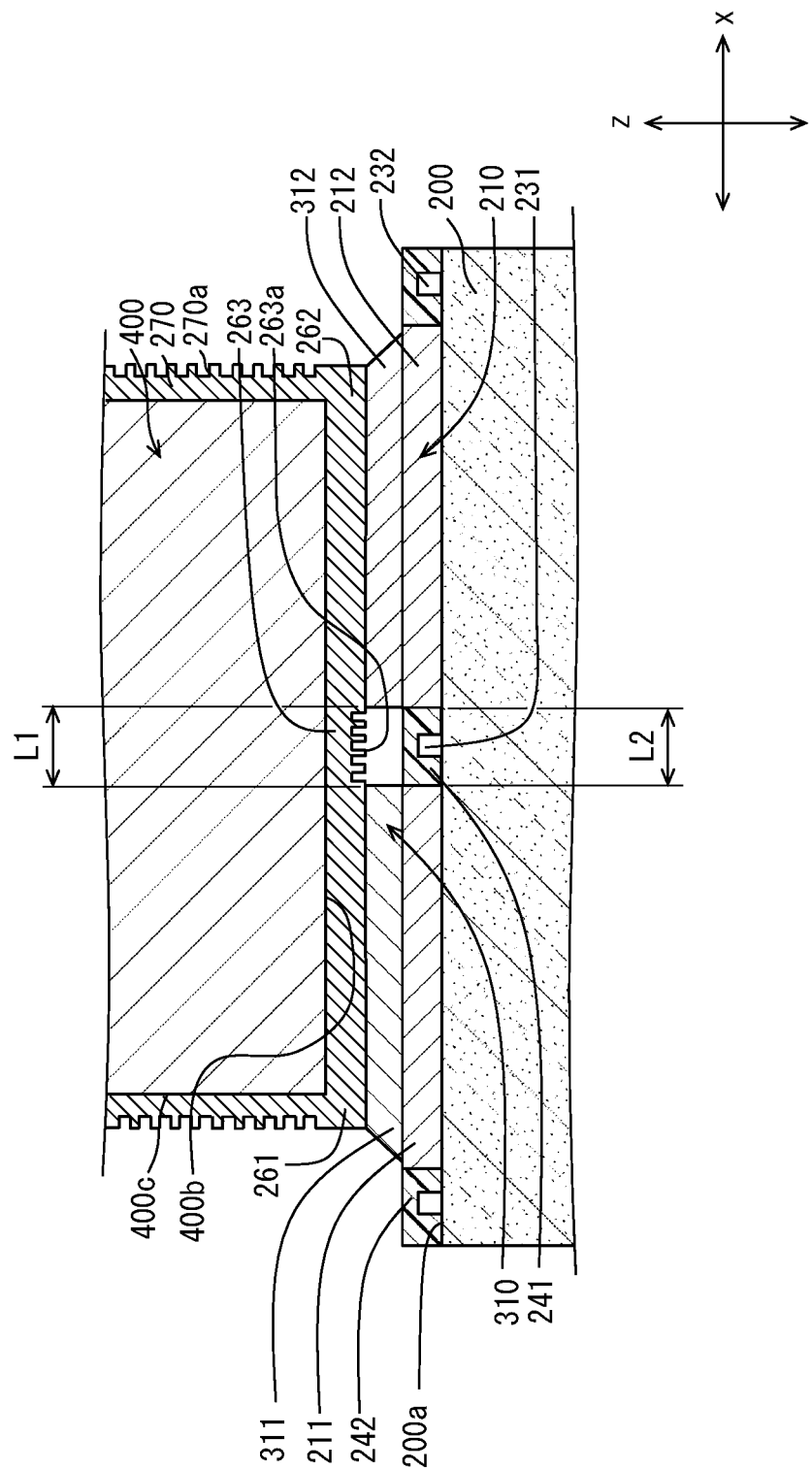
FIG. 16 is a cross-sectional view for illustrating a modification of the semiconductor device.

In the embodiments described so far, a mode in which the length L1 in the x direction of the first uneven portion 263a is longer than the length L2 in the x direction of the first protective portion 241 has been described. However, as shown in FIG. 16, the length in the x direction of the first uneven portion 263a may be the same as the length in the x direction of the first protective portion 241.

In this case, the contact angle between the portion of the first solder portion 311 close to the first protective portion 241 and the first emitter electrode 211 is a right angle. The contact angle between a portion of the second solder portion 312 close to the first protective portion 241 and the second emitter electrode 212 is a right angle. The first solder portion 311 and the second solder portion 312 are less likely to be bridged between the semiconductor element 200 and the terminal 400. The thickness of the first solder 310 is likely to be prevented from being locally reduced in the z direction.

(Fourth Modification)

Figure 17:
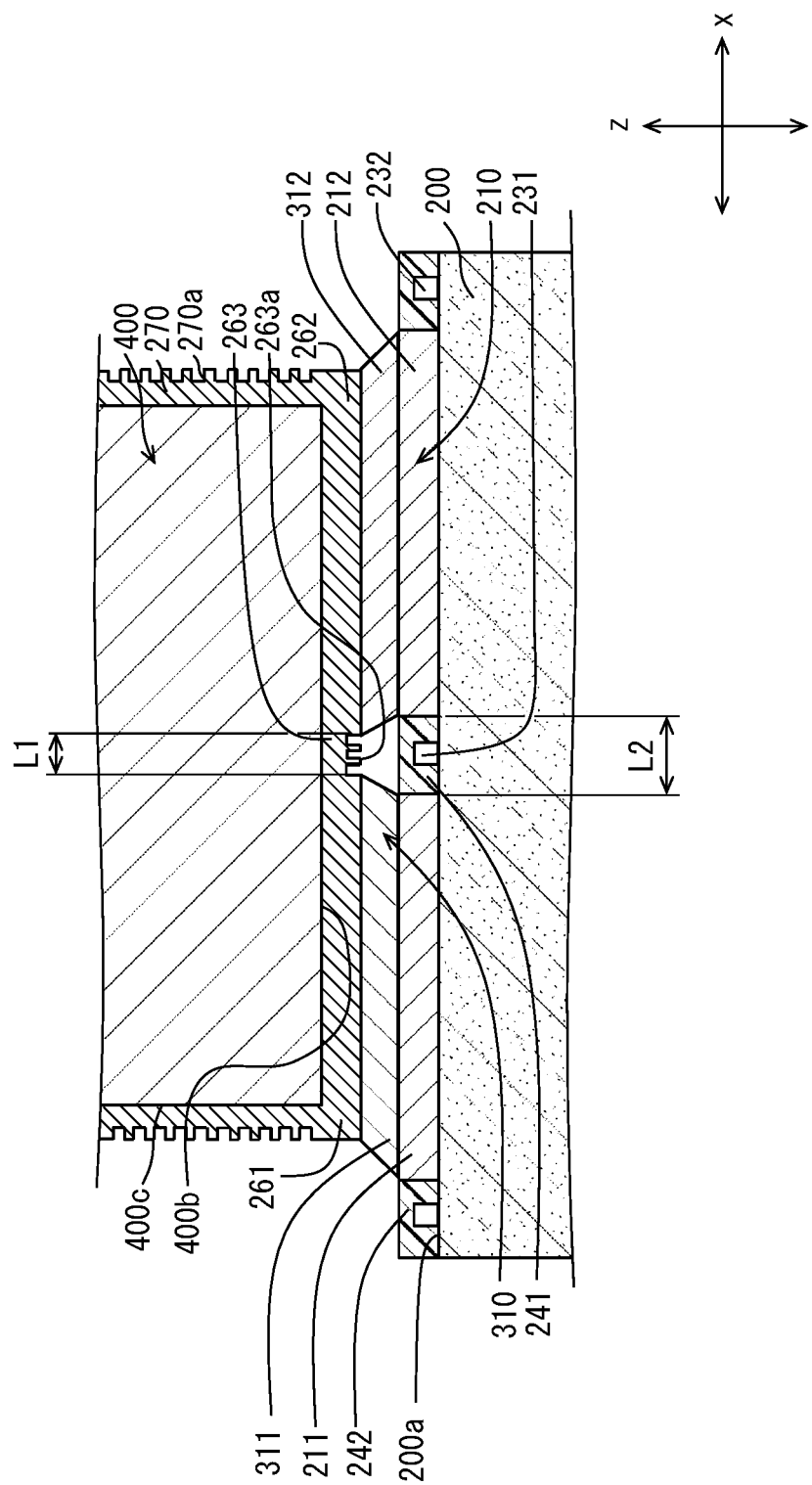
FIG. 17 is a cross-sectional view for illustrating a modification of the semiconductor device.

In addition, as shown in FIG. 17, the length L1 in the x direction of the first uneven portion 263a may be less than the length L2 in the x direction of first protective portion 241. Even in this case, the first solder portion 311 and the second solder portion 312 are less likely to be bridged between the semiconductor element 200 and the terminal 400. The thickness of the first solder 310 is likely to be prevented from being locally reduced in the z direction.

(Fifth Modification)

Although not shown, the projected area in the z direction of the first uneven portion 263a may include a part of the first protective portion 241. Accordingly, for example, the contact angle between the portion of the first solder portion 311 close to the first protective portion 241 and the first emitter electrode 211 may be an acute angle, and the contact angle between the portion of the second solder portion 312 close to the first protective portion 241 and the second emitter electrode 212 may be an obtuse angle.

(Sixth Modification)

Although not shown, a coating film containing polyimide or the like less likely to be wetted to the solder 300 may be provided on the second terminal surface 400b instead of the third facing plating 263. The first solder 310 has only to be partitioned into the first solder portion 311 and the second solder portion 312 by the coating film and the first protective portion 241.

(Other Modifications)

Although the present disclosure has been described in accordance with examples, it is understood that the present disclosure is not limited to the examples and structures. The present disclosure also includes various modifications, and modifications within an equivalent scope. In addition, although various combinations and modes are shown in the present disclosure, other combinations and modes including only one element, more elements, or less elements are also within the scope and idea of the present disclosure.

What is claimed is:

1. A semiconductor device comprising:
a semiconductor element including:
a plurality of first main electrodes disposed on a first main surface;
a second main electrode disposed on a second main surface opposite to the first main surface in a plate thickness direction; and
a protective film disposed on the first main surface and having at least one interposed film portion disposed between the plurality of first main electrodes;
a conductive member having a facing surface facing the first main surface in the plate thickness direction and having, on the facing surface:
a plurality of facing portions each facing a corresponding one of the plurality of first main electrodes in the plate thickness direction; and
at least one interposed conductive portion disposed between the plurality of facing portions in an arrangement direction in which the plurality of facing portions are arranged, wherein the at least one interposed conductive portion has a plurality of recesses; and
a plurality of solder portions disposed between the plurality of first main electrodes and the plurality of facing portions, the plurality of solder portions being separated away from each other by the at least one interposed film portion and the at least one interposed conductive portion to define a space between the plurality of solder portions, wherein
the at least one interposed film portion has lower wettability to the plurality of solder portions than the plurality of first main electrodes have, and the at least one interposed conductive portion has lower wettability to the plurality of solder portions than the plurality of facing portions have such that the at least one interposed film portion and the at least one interposed conductive portion avoid the plurality of solder portions in liquid phase entering into the space during soldering.

2. The semiconductor device according to claim 1, wherein
the at least one interposed conductive portion has a length in the arrangement direction that is greater than that of the at least one interposed film portion, and
the at least one interposed film portion is included in a projected area onto which the at least one interposed conductive portion is projected toward the first main surface in the plate thickness direction.

3. The semiconductor device according to claim 1, wherein
a sum of lengths in the arrangement direction of the plurality of facing portions is greater than a length in the arrangement direction of the at least one interposed conductive portion.

4. The semiconductor device according to claim 1, wherein
a length in the arrangement direction of the at least one interposed conductive portion is equal to or greater than a sum of twice a distance between the at least one interposed conductive portion and the at least one interposed film portion in the plate thickness direction and a length of the at least one interposed film portion in the arrangement direction.

5. The semiconductor device according to claim 1, wherein
the at least one interposed conductive portion includes an uneven surface that is formed between the plurality of facing portions.

6. The semiconductor device according to claim 1, wherein
the semiconductor element includes a signal wiring line configured to transmit a signal and extending along the first main surface, and
a part of the signal wiring line is coated with the at least one interposed film portion.

7. The semiconductor device according to claim 1, wherein
a contact angle between the plurality of solder portions and the at least one interposed film portion is an acute angle.

8. The semiconductor device according to claim 1, wherein
the conductive member further has, on the facing surface, a surrounding portion that entirely surrounds the at least one interposed conductive portion and the plurality of facing portions, and
the surrounding portion has a plurality of recesses in the plate thickness direction and has a low wettability to the plurality of solder portions than the plurality of facing portions.

9. The semiconductor device according to claim 1, wherein
the conductive member has an opposite surface opposite to the facing surface and a side surface connecting between the opposite surface and the facing surface,
the conductive member further has, on the side surface, a plurality of recesses.

10. The semiconductor device according to claim 1, wherein
in a cross-sectional view, each solder portion of the plurality of solder portions has a quadrangular pyramid frustum shape.

11. The semiconductor device according to claim 1, wherein
   a length in the arrangement direction of the plurality of recesses is longer than a length in the arrangement direction of the at least one interposed film portion.

\* \* \* \* \*